United States Patent [19]

Knappenberger et al.

[11] 4,293,519

[45] Oct. 6, 1981

[54] METHOD FOR POTTING AND ENCAPSULATING ELECTRONIC CIRCUITS

[75] Inventors: Thomas A. Knappenberger, Phoenix; James F. Landers, Jr., Tempe, both of Ariz.

[73] Assignee: Motorola Inc., Schaumburg, Ill.

[21] Appl. No.: 81,703

[22] Filed: Oct. 4, 1979

Related U.S. Application Data

[62] Division of Ser. No. 890,434, Mar. 27, 1978, abandoned.

[51] Int. Cl.$^3$ .............................................. B29D 6/02
[52] U.S. Cl. ........................... 264/272.13; 264/331.12
[58] Field of Search ........................... 264/272, 331.12

[56] References Cited

U.S. PATENT DOCUMENTS 3,533,985 10/1970 Lantz et al.
3,670,091  6/1972 Frantz et al. ........................ 264/272
3,849,187 11/1974 Fetscher ............................. 264/272
3,864,426  2/1975 Salensky .

OTHER PUBLICATIONS

"Embedding Processes and Materials", C. A. Harper, *Machine Design*, Jun. 9, 1966, pp. 150-173.

*Primary Examiner*—James B. Lowe

[57] ABSTRACT

A method for potting and encapsulating electronic circuits by providing a homogeneous mixture of uncured thermosetting resin and curing agent in a flowable powder form with a particle size in the range of approximately 60 mesh to 200 mesh and curable in a range of approximately 125° F. to 212° F., and hollow microspheres having a diameter in the range of approximately 5 microns to 300 microns, intermixing the resin-curing agent and microspheres in a ratio in the range of approximately 35 percent to 45 percent resin-curing agent to microspheres by weight, enclosing the electronic circuit with a form, pouring the homogeneous mixture in the form to surround one electronic circuit, and heating the mixture to the required temperature for curing.

2 Claims, No Drawings

METHOD FOR POTTING AND ENCAPSULATING ELECTRONIC CIRCUITS

This is a division of application Ser. No. 890,434 filed Mar. 27, 1978, now abandoned.

BACKGROUND OF THE INVENTION

The present invention pertains to material for potting and encapsulating electronic circuits utilized in high acceleration and high thermal cycling environments. In high acceleration environments, it is essential to utilize a material which is light-weight and strong to prevent movement of any of the electronic parts. In the high thermal cycling environments it is essential that the material has a low coefficient of linear expansion, relatively low modulus of elasticity (ratio of unit stress to unit deformation), high compression strength and low embedment stress. Other characteristics which must be considered include repairability, cure stresses and cure temperatures, flow of material, outgassing properties, etc.

In the prior art, it is well known to utilize solid resins and hollow glass microspheres for flotation purposes in water craft and the like. However, these solid resins must first be thoroughly mixed with a curing agent and then the microspheres must be intermixed with the catalyzed resin before it cures. It is extremely difficult to completely mix the resin and curing agent and then to mix the hollow glass spheres into the catalyzed resin so that each particle of resin is catalyzed by a particle of curing agent and each glass sphere is affixed to another glass sphere by a particle of catalyzed resin therebetween. If the entire mixture is not uniform and substantially homogeneous there will be a great variation in the physical characteristics thereof, not only between different batches of mixture but within a single batch.

These materials are not suitable for potting and encapsulating electronic circuits because the physical characteristics are unsuitable. For example, most known materials of this type have a cure temperature far in excess of that acceptable with electronic circuits, i.e., the electronic circuits will be practically ruined by the time the potting material is cured or the cure time is too long to be economically feasible.

SUMMARY OF THE INVENTION

In the present invention, potting and encapsulating material for electronic circuits utilized in high acceleration and high thermal cycling environments is prepared by intermixing a compound of uncured thermosetting resin and curing agent in a flowable powder form with a particle size in the range of approximately 60 mesh to 200 mesh and curable in a range of approximately 125° F. to 212° F. with hollow microspheres having a diameter in the range of approximately 5 microns to 300 microns, said mixture being in a ratio in the range of approximately 35 percent to 45 percent resin-curing agent to microspheres by weight, the exact ratio being determined by the desired final properties of the material, i.e., controlled compressive and crushing strength (imbedment stress, modulus of elasticity, sheer strength, compression strength and coefficient of linear expansion), controlled outgassing, controlled thermal expansion, controlled repairability and controlled thermal conductivity.

It is an object of the present invention to provide potting and encapsulating material for electronic circuits utilized in high acceleration and high thermal cycling environments, which material has physical properties which vary in accordance with the ratio of the resin-curing agent and microspheres utilized.

It is a further object of the present invention to provide a method of producing potting and encapsulating material for electronic circuits utilized in high acceleration and high thermal cycling environments.

These and other objects of this invention will become apparent to those skilled in the art upon consideration of the accompanying specification and claims.

DESCRIPTION OF THE PREFERRED EMBODIMENT

In high G, or high acceleration, environments, such as shock and vibration, component parts of an electronic circuit move relative to each other causing circuit performance variations and failures of solder joints. The traditional approach to immobilizing these components has been to secure them with adhesive bonding or staking, or encapsulating them in resin or foam. However, a problem comes about when thermal cycling occurs such as is induced upon turning devices on and off. Expansion differentials require some form of stress relief in the mounting of the electronic component to allow the flexibility needed to accommodate the expansion differentials of the material. When components are secured for the dynamic environments of shock and vibration, this rigid securing causes problems in thermal cycling. When parts are stress relieved for thermal cycling, the less rigid mounting causes problems in shock and vibration. The present invention has been developed to allow securing of components for high G level dynamic environments while allowing high numbers of thermal cycles. In addition, the new material allows ease of repair, low volatiles for use in "clean" space programs and substantially no pressure exerted on components in the cured condition. These properties make the material unique so that it can be used on high reliability and space programs. It is equally applicable to airborne and ground equipment and is especially useful on printed wiring assemblies.

To produce the potting and encapsulating material for electronic circuits, the first step is to select an uncured compound of thermosetting resin and curing agent in a flowable powder form. The thermosetting resin must be a material which is curable at a low enough temperature so that the curing does not damage the electronic components. Generally, if the resin is curable in a range of approximately 125° F. to 212° F. and the curing periods are relatively short, the electronic circuits will not be damaged. The final potting and encapsulating material must be flowable between and around the various electronic components and therefore must be in a flowable powder form and it has been found that a satisfactory particle size is generally in the range of 60 mesh to 200 mesh. For example, the thermosetting resin diglycidyl ether of bis phenol A and the curing agent 2-phenyl imidazole in a solid state may be processed, for example in a ball mill or the like, to produce a powder of the desired particle size. The processed thermosetting resin and curing agent is sifted in a screen with the desired mesh size to remove any oversized particles. By processing the resin and curing agent in this fashion the two are thoroughly intermixed to ensure proper catalyzing of each resin particle. The particular resin specified above can be purchased under the trademark "EPON 1001" of the Shell Chemical Company.

A supply of hollow microspheres may be obtained commercially from a variety of sources and, in general, these microspheres will be formed from a glass such as, silica (approximately 95 percent $SiO_2$), or from a thermosetting resin such as phenolic. In general, to ensure the correct flowability and the other physical properties of the potting and encapsulating material, the hollow microspheres should have a diameter in the range of approximately 5 microns to 300 microns and the wall thickness should be in the range of approximately 1 micron to 6 microns. The microspheres purchased commercially generally have a wide size range, because of manufacturing techniques. For example in the present embodiment microspheres having a particle size ranging from approximately 30 microns to 125 microns were utilized with a wall thickness of about 2 microns.

The powdered resin and curing agent are then mixed with the microspheres in the following manner. A desired quantity of microspheres is placed in a closed container and an amount of resin-curing agent in the range of approximately 35 percent to 45 percent resin-curing agent to microspheres by weight, is also placed in the closed container. The container is then closed to prevent the loss of material and shook vigorously for 2 to 3 minutes. Occasionally the container may be repositioned and the shaking mode may be varied to assure a thorough mixing action. This homogeneous mixture ensures that the previously catalyzed resin coats the adjacent microspheres and forms a type of material called foam. In general, it is believed that the spheres fuse at the tangent points to give a very cohesive foam material when cured. The potting and encapsulating material, mixed and in the powder form described above, may be stored by promptly placing it in a storage area at a temperature of approximately 40° F. plus or minus 7° F.

The potting and encapsulating material described above, is utilized by partially surrounding an electronic circuit with an encapsulating form, permanent shield, or the like so that the potting and encapsulating material may be contained in surrounding relationship to the electronic circuit. The form is then filled with the potting and encapsulating material which, because of its high flowability, completely surrounds the components of the electronic circuit. To assure void free potting the form or mold should be gently tapped or vibrated to promote flow and settling of the material. If the electronic circuit is to be encapsulated and the form or mold removed thereafter it is best to line the mold or form surfaces with Teflon tape or Teflon film so that the mold will release upon completion of the encapsulation. Once the mold or form is completely filled the entire structure will be placed in an oven and the potting and encapsulating material is cured at the required temperature. In general, the maximum allowable curing temperature is 100° C. for a two hour period, 82° C. for a three hour period or 74° C. for a four hour period. Because of the possible damage to the electronic components in the circuit, it is preferable to use the lowest possible curing temperature for the least amount of time.

It is especially crucial that there is very little or no shrinkage of the potting and encapsulating material during the cure step. It has been found, for example, that the greater the ratio of resin-curing agent to microspheres by weight of the potting and encapsulating material, the greater will be the shrinkage upon curing the material. When the ratio of the resin-curing agent to microspheres exceeds approximately 45 percent the shrinkage of the material upon curing becomes excessive and can cause damage to the electronic circuits being potted or encapsulated. Shrinkage of the plastic material may produce pressure on components which changes their electrical characteristics, or it may break solder joints and the like.

A second characteristic of the potting and encapsulating material, which is closely aligned with the shrinkage characteristic, is commonly referred to as embedment stress. Embedment stress is the amount of pressure produced on components in the electronic circuit due to temperature changes of the potting and encapsulating material. Again, if the embedment stress is excessive it will cause a change in electronic characteristics of the components and/or breakage of connections and solder joints. Embedment stress can be measured by embedding a pressure transducer in the plastic material and cycling it through the upper and lower temperature variations. For example, acceptable embedment stresses are under 400 pounds per square inch at a minus 30° F. and under 10 pounds per square inch at the cure temperature, generally 90° F. to 212° F. It has been found through extensive experimentation that the embedment stress can be substantially reduced by controlling the ratio of the resin-curing agent to microspheres in the potting and encapsulating material. In general, if the ratio of resin-catalyst to microspheres is maintained in the range of approximately 35 percent to 45 percent by weight, the embedment stress will be within acceptable limits.

Because the potting and encapsulating material is being utilized to maintain electronic components in fixed positions under high acceleration, or G, environments, it is essential that the compressive strength of the potting and encapsulating material is within predetermined limits. As the ratio of resin-catalyst to microspheres is reduced the ultimate compressive strength is also reduced. The compressive strength is determined by applying a pressure, measured in pounds per square inch, and measuring the amount of deflection of the potting and encapsulating material. In general, the ultimate stress of the material should be no less than approximately 100 psi. Through extensive experimentation, it has been found that a 35 percent ratio of resin-curing agent to microspheres will withstand 112 psi ultimate stress, while a ratio of 45 percent resin-catalyst to microspheres will withstand a compressive ultimate stress of 150 psi. In addition, a characteristic commonly referred to as the modulus of elasticity in compression is generally related to the compression characteristic. The modulus of elasticity is a measure of the pounds per square inch of stress produced by deflection of the potting and encapsulating material under compression. It is extremely important that the stress produced by the material must be very low (generally under 5 psi) for deflections in the range of 0 to 0.001 inches per inch of material, or a modulus of elasticity of 5000 psi.

In addition to the above properties dealing with the physical strength of the potting and encapsulating material, it is essential that the outgassing of the material is below predetermined standards if the material is to be used in high reliability and missile space programs. Outgassing is a measure of the amount of volatile condensable materials which are emitted by the potting and encapsulating material after curing. The percent of weight loss of the material because of the emission of the volatile materials is also an indication of the outgassing characteristic. The outgassing characteristic is measured in a vacuum, generally less than $10^{-5}$ Torr. The percent volatile condensable materials which is acceptable is below approximately 0.1 percent and the percent weight loss which is acceptable is below approximately 1.0 percent.

EXAMPLE

A flowable powdered potting and encapsulating material was produced using 40 percent by weight of an uncured thermosetting resin, diglycidyl ether of bis phenol A, with the curing agent 2-phenyl imidazole having a particle size such that it passed through a 150 mesh screen and hollow glass microspheres (over 95 percent $SiO_2$) having a diameter between 30 and 125 microns with a wall thickness of approximately 2 microns. The powdered resin-curing agent and microspheres were placed in a closed container and shook vigorously for two to three minutes with the container being occasionally repositioned to vary the shaking mode and assure a thorough mixing action. An electric circuit was potted with the above material by completely filling a form partially surrounding the circuit and curing the material for two hours at 100° C. The cured material produced no measurable shrinkage upon curing. Further, the material has an ultimate compressive strength of 134 psi. And the modulus of elasticity was such that 0.001 inches per inch of deflection produced less than 2 psi of stress (modulus of elasticity of 2000 psi). Upon temperature cycling the potted structure, well under 400 psi of embedment stress was exhibited at minus 30° F. and under 10 psi of embedment stress was exhibited between 90° F. and 212° F. Also, in the outgassing tests 0.02 percent volatile condensable materials were produced and 0.8 percent weight loss was exhibited.

A sample of the above potting and encapsulating material was utilized in which 35 percent by weight of resin-curing agent was included. The ultimate compressive strength dropped to 112 psi. The embedment stress was slightly reduced.

A third sample of the potting and encapsulating material was utilized wherein 45 percent by weight of resin-curing agent was included. In this sample the ultimate compressive strength rose to approximately 150 psi with the embedment stress increasing over the first sample somewhat. Because of the ultimate compressive strength requirements, it was determined that a range of approximately 35 to 45 percent by weight of resin-curing agent to microspheres is required to obtain the desired physical characteristics.

While we have shown and described specific embodiments of this invention, further modifications and improvements will occur to those skilled in the art. We desire it to be understood, therefore, that this invention is not limited to the particular form shown and we intend in the appended claims to cover all modifications which do not depart from the spirit and scope of this invention.

What is claimed is:

1. A method of potting an electronic circuit utilized in high acceleration and high thermal cycling environments comprising the steps of:
   (a) selecting an uncured compound consisting essentially of thermosetting resin and curing agent in a flowable powder form with a particle size in the range of approximately 60 mesh to 200 mesh, curable in a temperature range of approximately 125° F. to 212° F. at approximately ambient pressure and which produces, in a vacuum of less than $10^{-5}$ Torr, outgassing of a maximum of 0.1 percent volatile condensible materials and a maximum of 1.0 percent weight loss;
   (b) selecting a quantity of hollow microspheres having a diameter in the range of approximately 5 microns to 300 microns;
   (c) mixing said compound and said microspheres into a substantially homogeneous mixture consisting essentially of said compound and said microspheres in a predetermined ratio in the range of approximately 35 percent to 45 percent resin-curing agent to microspheres by weight;
   (d) partially enclosing the electronic circuit with a form to limit the flow of potting material;
   (e) pouring the homogeneous mixture in the form to surround the electronic circuit with mixture; and
   (f) heating the mixture to the required temperature for curing in a temperature range of approximately 125° to 212° F. at approximately ambient pressure.

2. A method of potting an electronic circuit utilized in high acceleration and high thermal cycling environments comprising the steps of:
   (a) providing an uncured compound consisting essentially of diglycidyl either of bis phenol A and 2-phenyl imidazole in a flowable powder form with a particle size in the range of approximately 60 mesh and 200 mesh and curable in a temperature range of approximately 125° F. to 212° F. at approximately ambient pressure;
   (b) selecting a quantity of hollow microspheres having a diameter in the range of approximately 5 microns to 300 microns;
   (c) mixing said compound and said microspheres into a substantially homogeneous mixture consisting essentially of said compound and said microspheres in a predetermined ratio in the range of approximately 35 percent to 45 percent resin-curing agent to microspheres by weight;
   (d) partially enclosing the electronic circuit with a form to limit the flow of potting material;
   (e) pouring the homogeneous mixture in the form to surround the electronic circuit with mixture; and
   (f) heating the mixture to the required temperature for curing in a temperature range of approximately 125° to 212° F. at approximately ambient pressure.

* * * * *